United States Patent
Dommer et al.

(10) Patent No.: US 7,233,084 B2
(45) Date of Patent: *Jun. 19, 2007

(54) MICROWAVE GENERATOR

(75) Inventors: Josef Dommer, Nürnberg (DE);
Helmut Hofmann, Gräfenberg (DE);
Geoffrey Staines, Röthenbach (DE)

(73) Assignee: Diehl Munitionssysteme GmbH & Co. KG, Röthenbach (DE)

( * ) Notice: Subject to any disclaimer, the term of this patent is extended or adjusted under 35 U.S.C. 154(b) by 475 days.

This patent is subject to a terminal disclaimer.

(21) Appl. No.: 10/802,148

(22) Filed: Mar. 17, 2004

(65) Prior Publication Data
US 2004/0190214 A1 Sep. 30, 2004

(30) Foreign Application Priority Data
Mar. 25, 2003 (DE) ................ 103 13 286

(51) Int. Cl.
*H02M 3/06* (2006.01)
(52) U.S. Cl. ..................................... 307/109
(58) Field of Classification Search ............... 307/109
See application file for complete search history.

(56) References Cited

U.S. PATENT DOCUMENTS

| 3,748,528 | A | | 7/1973 | Cronson |
| 4,760,311 | A | | 7/1988 | Wootton |
| 4,845,378 | A | | 7/1989 | Garbe et al. |
| 5,798,579 | A | * | 8/1998 | McPhee ............ 307/106 |
| 5,835,545 | A | | 11/1998 | Turchi |
| 6,822,394 | B2 | * | 11/2004 | Staines et al. ......... 315/39 |

FOREIGN PATENT DOCUMENTS

DE 35 28 338 C 1 8/1985
DE 101 51 565 A 1 10/2001

* cited by examiner

*Primary Examiner*—Robert L. Deberadinis
(74) *Attorney, Agent, or Firm*—Scully, Scott, Murphy & Presser, P.C.

(57) ABSTRACT

The superimposition of the microwave fields of an array (10) of microwave generators (11), with self-firing spark gaps (13) for the discharge of storage devices (43), which are charged up to a high voltage, results in an increase in field strength and a capacity for influencing the frequency spectrum of the emitted high-energy high-frequency field and the emission direction thereof.

9 Claims, 1 Drawing Sheet

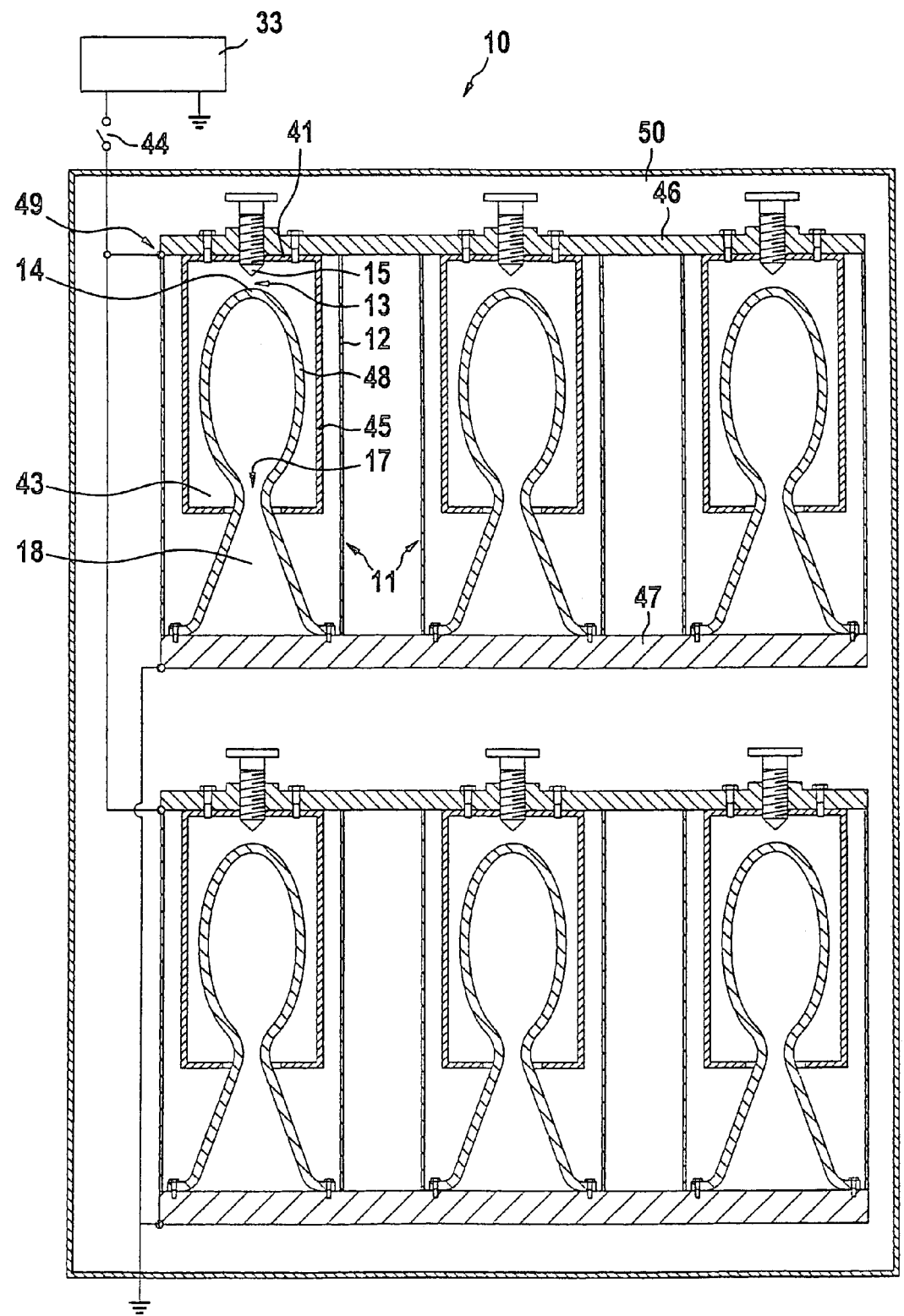

MICROWAVE GENERATOR

BACKGROUND OF THE INVENTION

1. Field of the Invention

The invention concerns a microwave generator with a short-circuit spark gap between collinearly arranged spark gap electrodes.

The function of such a generator is based on the fact that a high voltage source, for example an array of capacitors which is charged up in parallel in accordance with the principle of the Marx impulse voltage circuit and then connected in series is discharged by way of a spark gap. Such a discharge operation leads to a current flow which is initiated steeply and oscillates strongly, and thus affords correspondingly wide-band emission of a microwave spectrum of such high energy density that, in the more immediate proximity of such a microwave generator, radio communication is at least impaired and an electronic circuit, in particular at the input side, can be damaged or even destroyed.

2. Discussion of the Prior Art

It is known for example from U.S. Pat. No. 4,845,378 A to switch over arrays of capacitors by way of spark gap switches, as the high voltage source, in that case for generating an electromagnetic pulse for the simulation of a real nuclearly triggered impulse. In order on the other hand to emit microwave energy into a waveguide, it is known from U.S. Pat. No. 3,748,528 for an electrode which is of a cambered bottle-shaped configuration in contour to be arranged to project with its convex bottom end transversely into the waveguide in order thereby to form a spark gap with the wall region, in opposite relationship thereto, of the waveguide. The end of the bottleneck, which in contrast is flat, projects as an electrode of a further spark gap designed as a pulse shaper, into a cavity filled with protective gas. The counterpart electrode thereof, which is also flat, forms the end of the inner conductor of a coaxial arrangement which is mounted on the waveguide transversely with respect to the longitudinal extent thereof. The inner conductor thereof is charged up in opposite relationship to the spark gap by means of an additional spark gap serving as a switch and by way of a pulse shaper as well as a series resistor from a high voltage dc source, so that upon discharge firstly the pulse-shaping spark gap and then the microwave-generating spark gap are caused to respond.

In accordance with U.S. Pat. No. 4,760,311 A the development of a steep voltage wave front is influenced by electron beams. DE 35 28 338 C1 describes fast explosive-operated magnetic field compression for current amplification for a magnetic field effective as a non-lethal weapon. A comparable technology is used in U.S. Pat. No. 5,835,545 A for a compact intensive radiation source. Because of the possibility of affecting radio connections the effect of intensive microwave emission as a non-lethal weapon is propagated against enemy communication systems (see DER SPIEGEL, Issue July 1997, pages 53 ff, there the end of paragraph 3 of the left-hand column on page 54).

SUMMARY OF THE INVENTION

In accordance with the present invention what is involved is wide-band high-energy effects of a spark gap which, for the emission of microwave energy into a free space, promises a more advantageous level of efficiency than for example the use of a magneto-hydrodynamic generator operated with explosive. The present invention is based in particular on the technical object of providing a microwave generator (also referred to as an HPMW-generator) which is autonomous in regard to its power supply and which can be handled without problem in terms of its dimensions but which in particular in regard to interference radiation spectrum, range and energy density can be used in a particularly universal and effective fashion.

That object is attained by the combination set forth in the main claim of the essential features according to the invention, whereby the energy from an array of capacitors is transferred into a plurality of charge storage means which then self-triggeringly short-circuit so that the microwave fields, triggered by the strong short-circuit currents, of the individual radiating devices are superimposed on each other in order to achieve a greater level of energy density and thus range. If that superimposition effect is implemented in phase-shifted fashion, that affords a corresponding directional effect in the emission. When the radiating devices are arranged in front of a reflector plate (which is preferably flat or of a shallow-box configuration) the internal spacing of the plate relative to the radiating devices and the size of the plate provide for a frequency selection effect for the emitted microwave energy; in addition the emission is then limited substantially to that half-space in front of the plate, in which the radiating devices are arranged in front of the reflector plate, so that electronic installations operated behind the plate are quite effectively protected from being directly influenced by the microwave fields produced on the other side.

As therefore each radiating device of the group arrangement is fed by way of its own self-triggering spark gap, this therefore eliminates the complication and expenditure, which is critical in terms of function and which involves control procedures and appropriate circuitry, for external triggering by an additional switching section or by laser influencing of short-circuit spark gaps. The response behaviour on the part of the self-triggering spark gaps can be influenced by way of an adjustment of the electrode spacings of those short-circuit spark gaps. As shown in greater detail in structural aspects in our patent application DE 101 51 565.0, in addition the resonance space which is crucial in terms of the frequency spectrum of the microwave emission can be altered in its volume in order to optimise the emitted frequency mix in respect of its spectral key point.

BRIEF DESCRIPTION OF THE DRAWING

For further description of the invention and the possibilities afforded thereby and in regard to further advantages and modifications of the above-described configuration attention is directed to the further claims and to the description hereinafter of a preferred embodiment of the invention which is diagrammatically shown in the drawn, being in greatly abstracted form limited to what is essential and not entirely true to scale. The single FIGURE of the drawing is a front view in relation to axially sectioned microwave generators illustrating the group arrangement thereof in front of a reflector plate.

DETAILED DESCRIPTION OF THE INVENTION

The group 10 of radiating devices illustrated by way of example comprises a plurality of microwave generators 11. They each have coaxially in a hollow-cylindrical housing 12 of electrically insulating material a switching spark gap 13 between an electrode 14 in the form of a hollow spherical cap (of a diameter of the order of magnitude of the diameter of the housing 12) and an electrode 15 which in contrast is pointed and which is arranged in coaxial axially opposite relationship thereto outside same. The convex electrode 14 represents so-to-speak the outwardly bulging end portion of an electrode 48 which otherwise is of a bulbous bottle-shaped configuration, within a pot-shaped electrode 45 which cylindrically surrounds it. The reduced portion 17 of the inner electrode 48, which is in the shape of a bottle neck, is joined to the small base of a radiating device 18 which is of a hollow truncated conical acute-angled configuration and which, as a consequence of that funnel shape, acts at the same time as an impedance converter for emission of the high frequency mix when the two electrodes 45/48 are short-circuited for discharge of the charge storage means 43 which exists between them.

The electrode 15 of the spark gap 13 for short-circuit discharge of the storage means 43 which in contrast to the counterpart electrode 14 which is of a large-volume spherical shape is of a pointed configuration, is mounted coaxially with respect to the centre of that counterpart electrode 14 in the centre of the end portion 41 of the pot-shaped electrode 45 which concentrically surrounds the bottle-shaped electrode 48 with the counterpart electrode 14 and extends axially into the region of the reduced portion 17 thereof. That arrangement 45–48 therefore forms the charge storage means 43 which, by way of a switch 44—preferably in the form of a spark gap—can be applied to a charged capacitor array 33 of an impulse voltage circuit. After transfer of the charge thereof, the storage means 43 is discharged by way of short-circuiting by way of the self-triggering spark gap 13, the response behaviour of which is influenced by the spacing of the electrodes 14–15 relative to each other, apart from the mutual surface geometries of the electrodes 14–15 thereof. That spacing can be fixedly predetermined by the arrangement of the two electrodes 14–15, with the structure of the charge storage means 43; or the electrode 15 is axially adjustable with respect to the electrode 14 which is fixed with respect to the apparatus, for example as diagrammatically shown by way of a fine screwthread in the nature of a micrometer screw which, for example from a condition of the electrodes 14–15 initially bearing against each other, is unscrewed to a definedly predetermined internal spacing. That then determines the response behaviour of the spark gap 13 for initiation of the powerfully oscillating short-circuit currents upon discharge of the storage means 43, which are emitted by the frustoconical radiating device 18 after impedance matching therein.

A plurality of such microwave generators 11 are arranged in a row and column assembly as the group 10 of radiating devices, with parallel connection of their charge storage means 43. By way of electrically conductive mounting brackets 46 and 47 respectively, their charge storage means which are later to be short-circuited are for example as diagrammatically illustrated at the same time mechanically supported and electrically connected together and taken to the array of capacitors 33. On the one hand the outer electrodes 45 by way of the end portions 41 thereof and on the other hand the inner electrodes 48 of the storage means 43 by way of the radiating devices 18 thereof are connected in mutually parallel relationship.

When all spark gaps 13 fire at the same time, the microwave generators 11 emit substantially in-phase spectra which are superimposed in a direction transversely with respect to the mounting plane of the microwave generators 11 and which are therefore concentrated, with an increase in the effective range. If in contrast for example only the microwave generators 11 which are arranged one above the other in a column fire at the same time and the microwave generators which are displaced in relation thereto in respect of the column arrangement fire with a time delay, the superimposition of the microwave spectra emanating from the radiating devices 18 affords a microwave emission superimposition characteristic which is pivoted out of the normal to the mounting plane (as is known as such for example for focusing and pivoting the transmitting and receiving lobes of phase-controlled group radar installations).

A specifically targeted phase displacement between the response of individual ones of the microwave generators 11 can be adjusted primarily by way of the automatic response behaviour, that is to say in particular the length of the spark gap 13 and the geometry of the electrodes 14–15 thereof for discharge of the capacitor 43; however it can also be structurally predetermined by virtue of the size of the capacitor 43 on the basis of the spacing between the outer and inner electrodes 45–48 thereof and the surface dimensions, which can be projected on to each other, thereof. A further possible way of achieving a given superimposition characteristic which deviates from the perpendicular on to the fixing plane of the microwave generators 11 is a phase-shifted feed for the individual charge storage means 43 from the capacitor array 33 by way of staggered inductors. The eccentric feed, diagrammatically shown in the drawing, of the electrical energy from the capacitor array 33 into the storage means 43 from an outside point of the mounting brackets 46/47, by virtue of the inductive behaviour of the electrical connections by way of the mounting brackets 46/47, already provides for time-delayed charging of the storage means 43 with the increase in the distance thereof from a lateral feed location 49. An increase in the transit time effect upon serial charging of the storage means 43 can be achieved in that individual electrically mutually insulated mounting brackets 46/47 are provided for holding the individual microwave generators 11, between which there are couplings of relatively high inductance (which is also variable by for example the coil length).

If that array 10 of high-power microwave sources 11 is arranged in front of an electrically conducting reflector plate 50 which is flat or which, as diagrammatically illustrated, is in the form of a shallow box (that is to say surrounded by a narrow rim), then emission of the microwave energy from the frustoconical portions 18 takes place without transit time effects substantially in the direction of the normal on to the plate 50, at the equipment-mounting side thereof, but not through the reflector plate 50 in the opposite direction; high-frequency installations operated there therefore remain substantially protected from the damaging or indeed destructive HPMW-effect. The spacing of the individual radiating devices 18 from the plate 50 influences the effective spectral key point in the respectively emitted microwave spectrum. Differing spacings in respect of the individual, mutually juxtaposed radiating devices 18 with respect to the reflector plate 50 are also of influence on the superimposition of the individual fields thereof and thus on the overall effective emission in accordance with spectral distribution, intensity and direction.

Thus the superimposition according to the invention of the microwave fields of an array 10 of microwave generators 11, with self-firing spark gaps 13 for the discharge of storage means 43 charged up to a high voltage, results in an increase in field strength and a capacity for influencing the frequency spectrum of the emitted high-energy high-frequency field and the emission direction thereof.

The invention claimed is:

1. A microwave generator (11) with a short-circuit spark gap (13) between collinearly arranged spark gap electrodes (14–15), wherein the spark gap (13) is in the form of an untriggered short-circuit switch with a second electrode (15) arranged opposite an electrode (14) which is in the form of a spherical cap and by which a charge storage means (43) having a pot-shaped outer electrode (45) is dischargeable, through the end portion (41) of which electrode (45) there projects the second electrode (15), and in concentric relationship therewith an inner electrode (48) which is bulbous in a bottle shape and the end portion of which is the spherical cap-shaped electrode (14) and is connected collinearly through a bottle neck-shaped reduced portion (17) thereof to a frustoconical radiating device (18) disposed substantially outside of the outer electrode (45), said second electrode (15) being a pointed electrode, and a plurality of such microwave generators (11) being arranged in a group (10) and which are electrically connected in parallel with each other with their charge storage means (43).

2. A microwave generator according to claim 1 the inner electrode (48) adjoins the smaller base of the radiating device (18) through a bottle neck-shaped reduced portion (17) thereof and extends into the region of the reduced portion (17) between the outer electrode (45).

3. A microwave generator according to claim 1 wherein various of the spark gaps (13) are adjusted to mutually different response behaviors.

4. A microwave generator according to claim 1, wherein said charge storage means (43) are adjusted to different capacitances.

5. A microwave generator according to claim 1, wherein individual ones of the charge storage means (43) are charged up inductively delayed in relation to others from a capacitor array (33).

6. A microwave generator according to claim 1, wherein the radiating devices (18) are arranged at an internal spacing in front of a common reflector plate (50).

7. A microwave generator according to claim 6, wherein individual said radiating devices (18) are arranged at differing distances in front of the reflector plate (50).

8. A microwave generator according to claim 1, wherein the pointed electrode (15) of the spark gap (13) is adjustable with respect to the cap-shaped electrode (14) through the end portion (41) of the pot-shaped outer electrode (45).

9. A microwave generator according to claim 1, wherein the outer electrodes (45) by their end portions (41) and the inner electrodes (48) by the radiating devices (18) are structurally held to mounting brackets (46 and 47 respectively) and are electrically connected in parallel with each other.

* * * * *